United States Patent
Inoue (10) Patent No.: US 10,964,841 B2
(45) Date of Patent: Mar. 30, 2021

(54) METHOD FOR MANUFACTURING LIGHT-EMITTING ELEMENT

(71) Applicant: NICHIA CORPORATION, Anan (JP)

(72) Inventor: Naoto Inoue, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/807,853

(22) Filed: Mar. 3, 2020

(65) Prior Publication Data

US 2020/0287074 A1    Sep. 10, 2020

(30) Foreign Application Priority Data

Mar. 8, 2019   (JP) .................. 2019-043118

(51) Int. Cl.
   *H01L 33/00*   (2010.01)
   *H01L 21/78*   (2006.01)
   *B23K 26/53*   (2014.01)
   *B23K 26/57*   (2014.01)

(52) U.S. Cl.
   CPC .......... *H01L 33/0095* (2013.01); *B23K 26/53* (2015.10); *B23K 26/57* (2015.10); *H01L 21/78* (2013.01); *H01L 33/007* (2013.01)

(58) Field of Classification Search
   CPC ... H01L 33/007; H01L 33/0075; H01L 21/78; H01L 33/0095; B23K 26/53; B23K 26/57
   See application file for complete search history.

(56) References Cited

U.S. PATENT DOCUMENTS

| 2007/0111481 | A1  | 5/2007 | Tamura et al. |
| 2015/0221816 | A1* | 8/2015 | Tajikara ................ B23K 26/53 |
| | | | 438/33 |
| 2018/0247871 | A1  | 8/2018 | Inoue et al. |
| 2019/0081201 | A1  | 3/2019 | Inoue et al. |

FOREIGN PATENT DOCUMENTS

| JP | 2007-165850 A | 6/2007 |
| JP | 2008-078440 A | 4/2008 |
| JP | 2018-142702 A | 9/2018 |
| JP | 2019-050367 A | 3/2019 |

* cited by examiner

*Primary Examiner* — Savitri Mulpuri (74) *Attorney, Agent, or Firm* — Foley & Lardner LLP (57) ABSTRACT

A method for manufacturing a light-emitting element includes: providing a wafer comprising: a substrate having a first surface and a second surface, and a semiconductor structure provided at the first surface; irradiating a laser beam into an interior of the substrate from a second surface side of the substrate, which comprises: forming a plurality of first modified regions, a plurality of second modified regions, and a plurality of third modified regions in the interior of the substrate; and subsequently, separating the wafer into a plurality of light-emitting elements.

20 Claims, 7 Drawing Sheets

METHOD FOR MANUFACTURING LIGHT-EMITTING ELEMENT

CROSS-REFERENCE TO RELATED APPLICATION

This application claims priority to Japanese Patent Application No. 2019-043118, filed on Mar. 8, 2019, the disclosure of which is hereby incorporated by reference in its entirety.

BACKGROUND

The disclosure relates to a method for manufacturing a light-emitting element.

Generally, a semiconductor light-emitting element is obtained by, for example, dicing a wafer in which a compound semiconductor layer is epitaxially grown on a sapphire substrate. Laser stealth dicing is known as a wafer dicing technique in which modified regions are formed by concentrating a laser beam in a substrate interior and by singulating the wafer by using cracks extending from the modified regions as starting points.

SUMMARY

The present disclosure is directed to a method for manufacturing a light-emitting element in which the meandering of cracks can be suppressed while maintaining a high fracture strength in a laser beam irradiation process before singulation.

In one embodiment of the present disclosure, a method for manufacturing a light-emitting element, the method comprising:
providing a wafer comprising:
a substrate having a first surface and a second surface, and
a semiconductor structure provided at the first surface;
irradiating a laser beam into an interior of the substrate from a second surface side of the substrate, which comprises:
forming a plurality of first modified regions in the interior of the substrate by scanning the laser beam at a first irradiation pitch along a first direction parallel to the second surface,
subsequently, forming a plurality of second modified regions in the interior of the substrate between the second surface and the first modified regions by scanning the laser beam at a second irradiation pitch along the first direction, the second irradiation pitch being wider than the first irradiation pitch, and
subsequently, forming a plurality of third modified regions in the interior of the substrate at a depth within a range of the second modified regions by scanning the laser beam at a third irradiation pitch along the first direction, an output of the laser beam in the step of forming the plurality of third modified regions being higher than an output of the laser beam in the step of forming the plurality of second modified regions, the third irradiation pitch being narrower than the second irradiation pitch; and
subsequently, separating the wafer into a plurality of light-emitting elements.

According to a method for manufacturing a light-emitting element in the disclosure, the meandering of cracks can be suppressed while maintaining a high fracture strength in a laser beam irradiation process before singulation.

DETAILED DESCRIPTION OF EMBODIMENTS

Embodiments will now be described with reference to the drawings. The same components in the drawings are marked with the same reference numerals.

Figure 1:
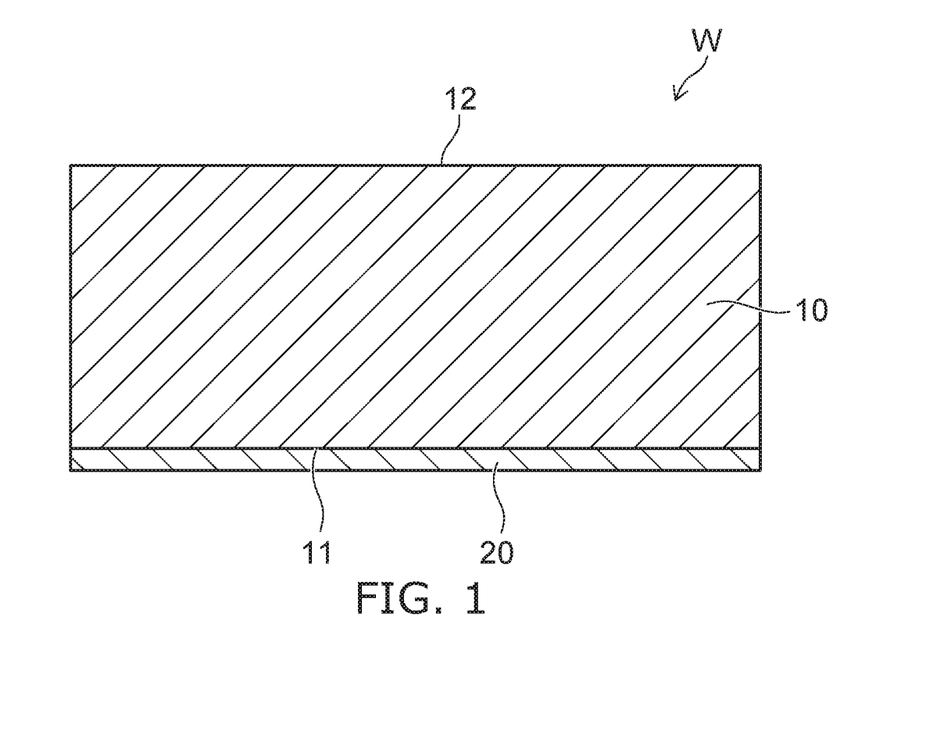
FIG. 1 is a schematic cross-sectional view of a wafer on which a method for manufacturing a light-emitting element of an embodiment of the invention is used.

FIG. 1 is a schematic cross-sectional view of a wafer W on which a method for manufacturing a light-emitting element of the one embodiment of the invention is used.

The wafer W includes a substrate 10 and a semiconductor structure 20. The substrate 10 has a first surface 11, and a second surface 12 on the side opposite to the first surface 11. The semiconductor structure 20 is provided at the first surface 11.

The substrate 10 may be, for example, a sapphire substrate. The first surface 11 may be, for example, the c-plane of the sapphire. The first surface 11 may be oblique to the c-plane within a range in which the semiconductor structure 20 can be formed to have good crystallinity.

The semiconductor structure 20 may include, for example, a nitride semiconductor represented by $In_xAl_yGa_{1-x-y}N$ ($0 \le x$, $0 \le y$, and $x+y<1$). The semiconductor structure 20 includes an active layer, and the peak wavelength of the light emitted by the active layer may be, for example, not less than 360 nm and not more than 650 nm.

The method for manufacturing the light-emitting element of the embodiment includes a process of irradiating a laser beam into the interior of the substrate 10, and a process of separating the wafer W into multiple light-emitting elements after the laser beam irradiation process.

Figure 2:
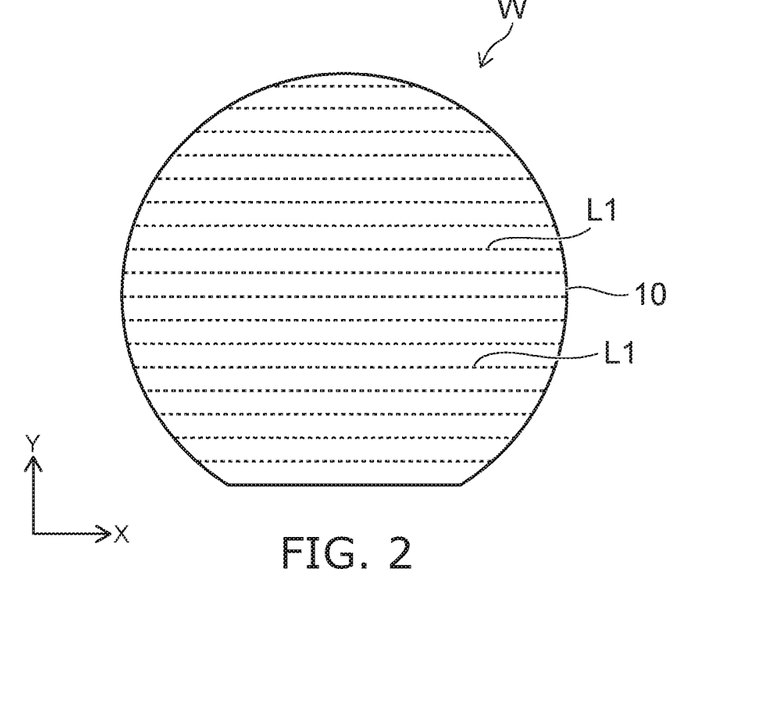
FIG. 2 to FIG. 5 are schematic plan views showing a method for manufacturing a light-emitting element of an embodiment of the invention.
Figure 3:
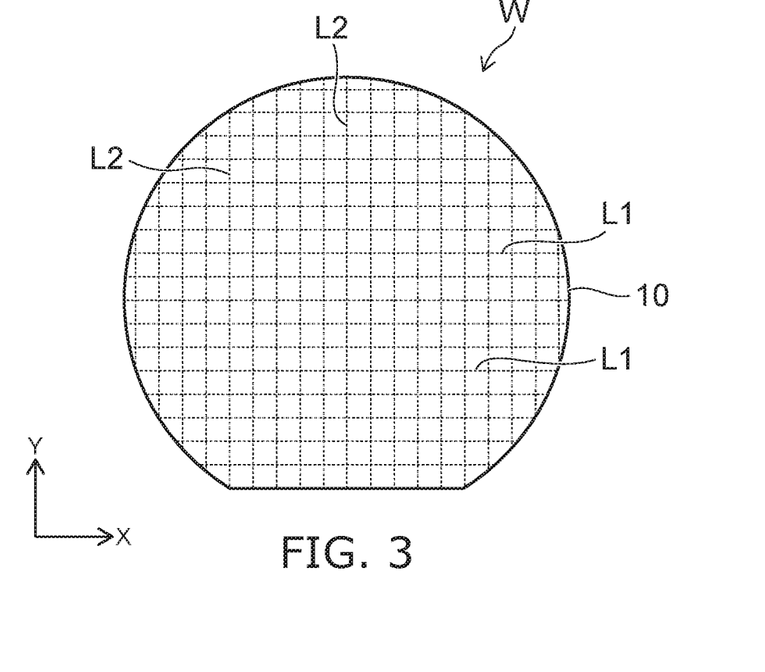

FIG. 2 and FIG. 3 are schematic plan views of the wafer W showing the laser beam irradiation process.

An X-direction and a Y-direction are two directions orthogonal to each other in a plane parallel to the first surface 11 and the second surface 12 of the substrate 10 shown in FIG. 1.

The laser beam irradiation process includes a process of forming multiple dicing lines L1 along the X-direction by scanning the laser beam multiple times along the X-direction (FIG. 2), and a process of forming multiple dicing lines L2 along the Y-direction by scanning the laser beam multiple times along the Y-direction before or after forming the dicing lines L1 (FIG. 3). For example, the X-direction may be aligned with the m-axis direction of the sapphire, and the Y-direction is aligned with the a-axis direction of the sapphire.

The dicing lines L1 and L2 correspond to columns of multiple modified regions described below that are formed in the interior of the substrate 10 by laser beam irradiation.

The irradiated laser beam is concentrated at a position having a designated depth in the interior of the substrate 10, and the energy of the laser beam concentrates at the position. Modified regions that are more embrittled than portions not subjected to the laser beam irradiation are formed at the irradiation portion (the concentration portion) of the laser beam.

For example, the laser beam may be emitted in pulse form. For example, a Nd:YAG laser, a titanium sapphire laser, a Nd:YVO$_4$ laser, a Nd:YLF laser, or the like may be used as the laser light source. The wavelength of the laser beam is a wavelength of light that passes through the substrate 10. For example, the laser beam may have a peak wavelength not less than 800 nm and not more than 1200 nm.

Figure 4:
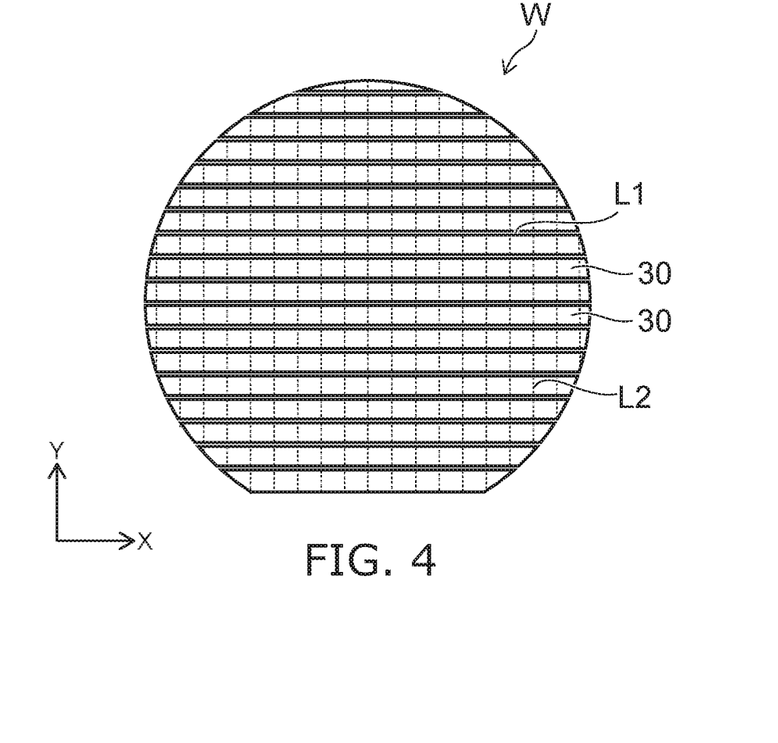
Figure 5:
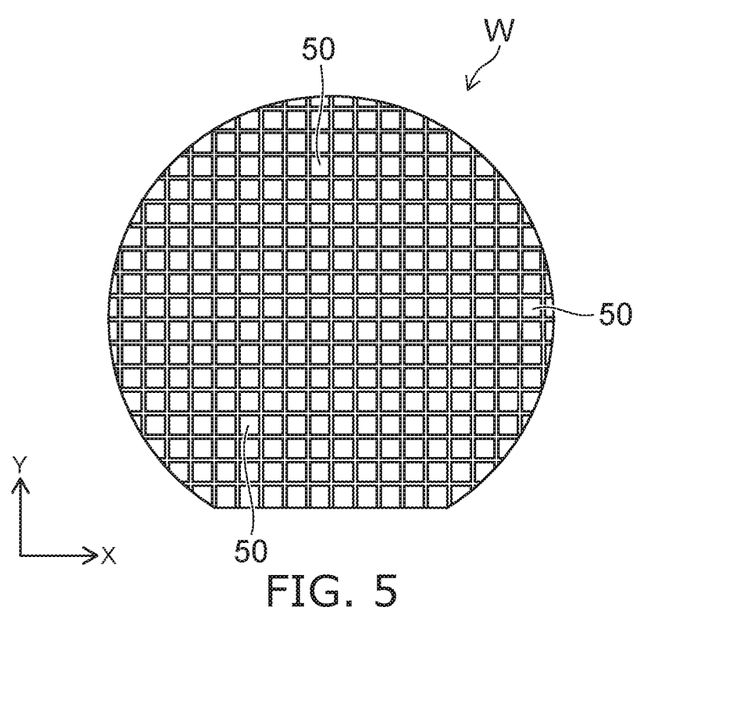

FIG. 4 and FIG. 5 are schematic plan views of the wafer W that show the separation process.

For example, after the laser beam irradiation process, first, a singulation process may be performed along the dicing lines L1. As shown in FIG. 4, the wafer W is separated into multiple bars 30. Subsequently, a singulation process is performed along the dicing lines L2, and the wafer W is separated into multiple light-emitting elements 50 as shown in FIG. 5.

Details of the laser beam irradiation process will now be described.

The laser beam irradiation process in the embodiment includes a first scanning process, a second scanning process, and a third scanning process. For example, first, the dicing lines L1 described above may be formed by the first scanning process, the second scanning process, and the third scanning process along the X-direction (a first direction, which is parallel to the second surface 12), thereby forming, in the interior of the substrate 10, a plurality of first modified regions, a plurality of second modified regions, and a plurality of third modified regions. Subsequently, the dicing lines L2 described above may be formed by the first scanning process, the second scanning process, and the third scanning process along the Y-direction (a second direction, which is parallel to the second surface 12 and crosses the first direction), thereby forming, in the interior of the substrate 10, a plurality of fourth modified regions, a plurality of fifth modified regions, and a plurality of sixth modified regions). Although the laser beam irradiation process that includes the first scanning process, the second scanning process, and the third scanning process is performed in the two directions of the X-direction and the Y-direction in the embodiment, the effects described above are provided even when the laser beam irradiation process is performed only in one direction of the X-direction or the Y-direction.

Although the first scanning process, the second scanning process, and the third scanning process along the Y-direction are described in the following example, the first scanning process, the second scanning process, and the third scanning process along the X-direction are performed similarly.

Figure 6A:
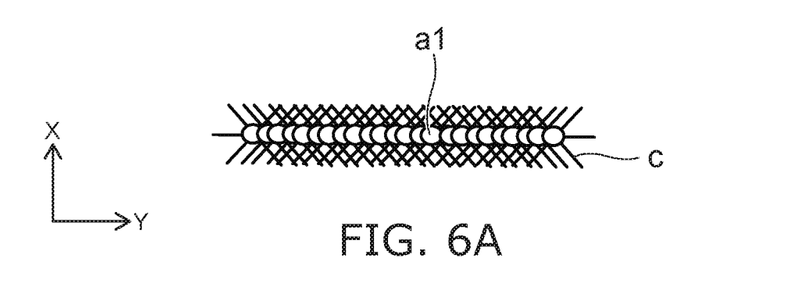
FIG. 6A is a schematic plan view of a laser beam irradiation portion of a first scanning process of the embodiment of the invention.
Figure 6B:
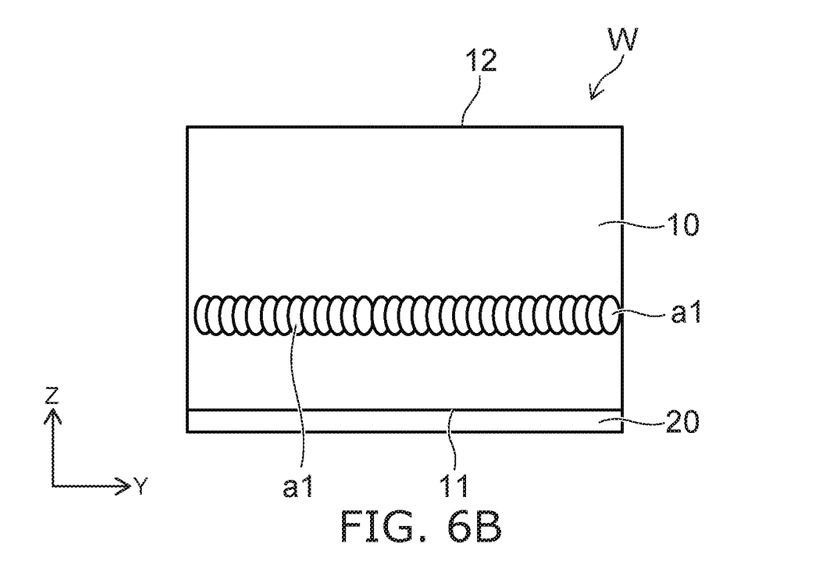
FIG. 6B is a schematic cross-sectional view of the laser beam irradiation portion of the first scanning process of the embodiment of the invention.

FIG. 6A is a drawing of the laser beam irradiation portion of the first scanning process when viewed from a Z-direction. FIG. 6B is a schematic cross-sectional view of the laser beam irradiation portion of the first scanning process.

Figure 6C:
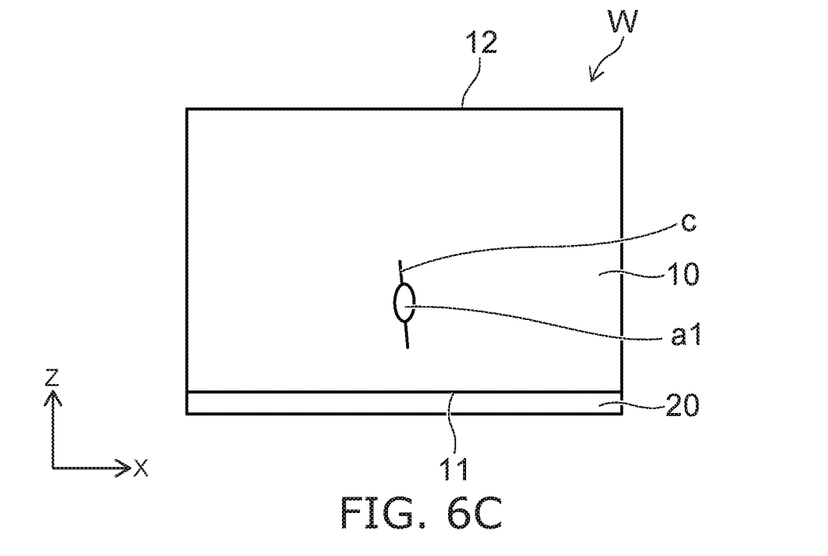
FIG. 6C is a schematic cross-sectional view of the laser beam irradiation portion of the first scanning process of the embodiment of the invention.

In FIG. 6B and FIG. 6C, the Z-direction is aligned with the thickness direction of the wafer W and is orthogonal to the X-direction and the Y-direction. FIG. 6B illustrates a cross section along the Y-direction, which is the scanning direction of the laser beam, and FIG. 6C illustrates a cross section along the X-direction orthogonal to the scanning direction of the laser beam.

In the first scanning process, the laser beam is irradiated through the second surface 12 side and scanned discretely along the Y-direction at a first irradiation pitch in the interior of the substrate 10. By scanning at the first irradiation pitch, multiple first modified regions a1 are formed densely to overlap each other along the Y-direction.

In the first scanning process, it is favorable for the output of the laser beam to be not less than 0.05 W and not more than 0.2 W, e.g., 0.14 W. It is favorable for the first irradiation pitch to be 2.5 μm or less, e.g., 1.5 μm.

The thickness of the substrate 10 is about 150 μm. For example, a position at a depth of 20 to 50 μm from the second surface 12 is an example of the setting value of the focus position of the laser beam in the first scanning process.

In the first modified regions a1 formed by the irradiation of the laser beam, stress is generated, and cracks c occur due to the stress. When viewed from the c-plane side of the sapphire, which is a hexagonal crystal, the a-axis directions are three directions at 60°-spacing, and the cracks c are formed easily along the three directions of the a-axes as shown in FIG. 6A.

According to verifications described below, it was found that the fracture strength of the wafer W is strongly dependent on the irradiation pitch of the laser beam, and a high fracture strength is obtained by reducing the irradiation pitch of the laser beam. The modified regions that are formed by the irradiation of the laser beam are formed more densely as the irradiation pitch of the laser beam decreases. It is considered that by densely forming the modified regions, voids do not exist easily in the modified regions, and a high fracture strength is obtained.

In the first scanning process of the embodiment, the fracture strength of the wafer W can be high because the multiple first modified regions a1 are densely formed to overlap each other along the Y-direction. Unintended breakage of the wafer W in the laser irradiation process before the separation process can be suppressed thereby.

Verification results relating to the conditions of the first irradiation pitch in the first scanning process will now be described.

In the verification, a sapphire substrate having a thickness of 200 μm was used as the substrate 10. The planar configuration of each of the samples was a square having 10.2 mm sides. A laser beam was irradiated into the central portion of the sample with varying irradiation conditions. The laser beam was irradiated along the m-axis of the sapphire substrate. After the irradiation of the laser beam, the fracture strength of the sample was measured. The pressing speed of the head applied to the sample in the measurement of the fracture strength was 0.05 mm/sec.

For a sample SP11, the output of the laser beam was 0.35 W, and the irradiation pitch of the laser beam was 1.5 µm. For the sample SP11, the pulse width of the laser beam was 5.0 ps.

For a sample SP12, the output of the laser beam was 0.35 W, and the irradiation pitch of the laser beam was 2.0 µm. For the sample SP12, the pulse width of the laser beam was 5.0 ps.

For a sample SP13, the output of the laser beam was 0.35 W, and the irradiation pitch of the laser beam was 2.5 µm. For the sample SP13, the pulse width of the laser beam was 5.0 ps.

For a sample SP14, the output of the laser beam was 0.35 W, and the irradiation pitch of the laser beam was 3.0 µm. For the sample SP14, the pulse width of the laser beam was 5.0 ps.

Thus, among the irradiation conditions of the laser beam for the samples SP11 to SP14, the value of the output was the same, and the value of the pulse width was the same, but the value of the irradiation pitch was modified.

Figure 9:
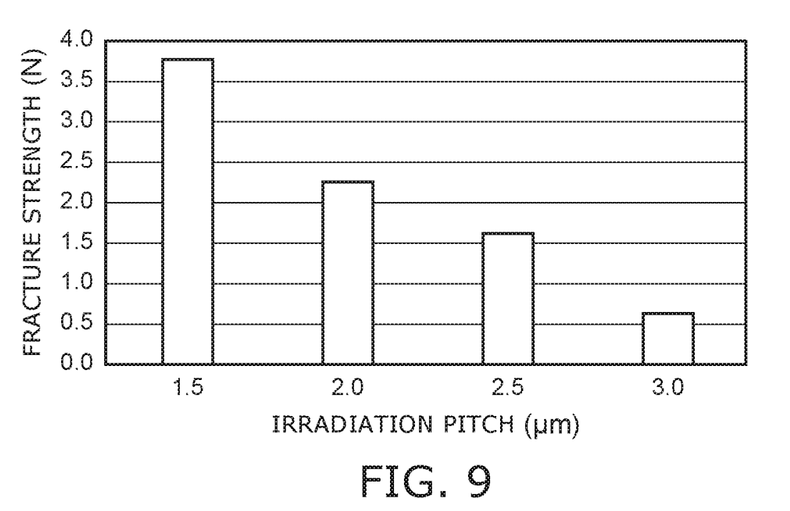
FIG. 9 is a graph illustrating the verification results on the method for manufacturing the light-emitting element of the embodiment of the invention.

FIG. 9 is a graph illustrating the verification results.

The vertical axis of FIG. 9 is the fracture strength (newtons: N). The fracture strengths of the samples SP11 to SP14 recited above are shown in FIG. 9. The fracture strengths of the samples SP11 to SP14 shown in FIG. 9 each are average values of the values obtained by measuring the samples SP11 to SP14 five times each.

The fracture strength of the sample SP11 (having an irradiation pitch of 1.5 µm) was 3.8 N.

The fracture strength of the sample SP12 (having an irradiation pitch of 2.0 µm) was 2.3 N.

The fracture strength of the sample SP13 (having an irradiation pitch of 2.5 µm) was 1.6 N.

The fracture strength of the sample SP14 (having an irradiation pitch of 3.0 µm) was 0.6 N.

It can be seen from FIG. 9 that the fracture strength is strongly dependent on the irradiation pitch of the laser beam. A high fracture strength is obtained by reducing the irradiation pitch. The fracture strength when the irradiation pitch is 2.5 µm is not less than 2 times the fracture strength when the irradiation pitch is 3.0 µm, and the fracture strength increases further as the irradiation pitch decreases to 2.0 µm and 1.5 µm. According to the experiment results, it is desirable for the first irradiation pitch to be 2.5 µm or less in the first scanning process that is directed to provide a high fracture strength.

In the experiment described above, the laser beam was irradiated along the m-axis of the sapphire substrate. It is considered that results similar to those of FIG. 9 are obtained also when the laser beam is irradiated along the a-axis of the sapphire substrate.

Figure 7A:
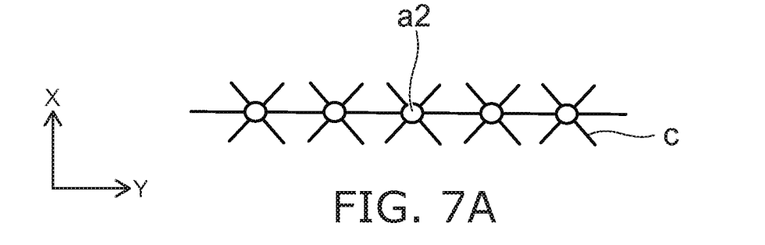
FIG. 7A is a schematic plan view of a laser beam irradiation portion of a second scanning process of the embodiment of the invention.
Figure 7B:
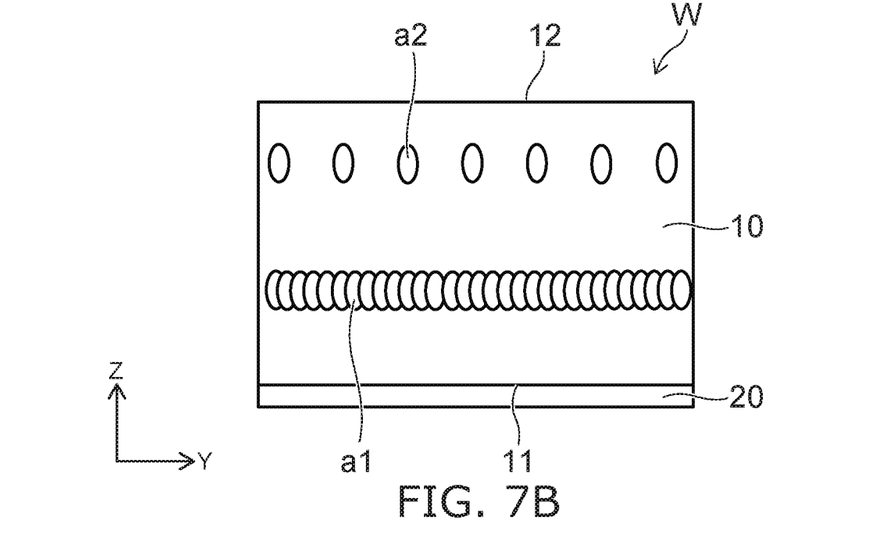
FIG. 7B is a schematic cross-sectional view of the laser beam irradiation portion of the second scanning process of the embodiment of the invention.
Figure 7C:
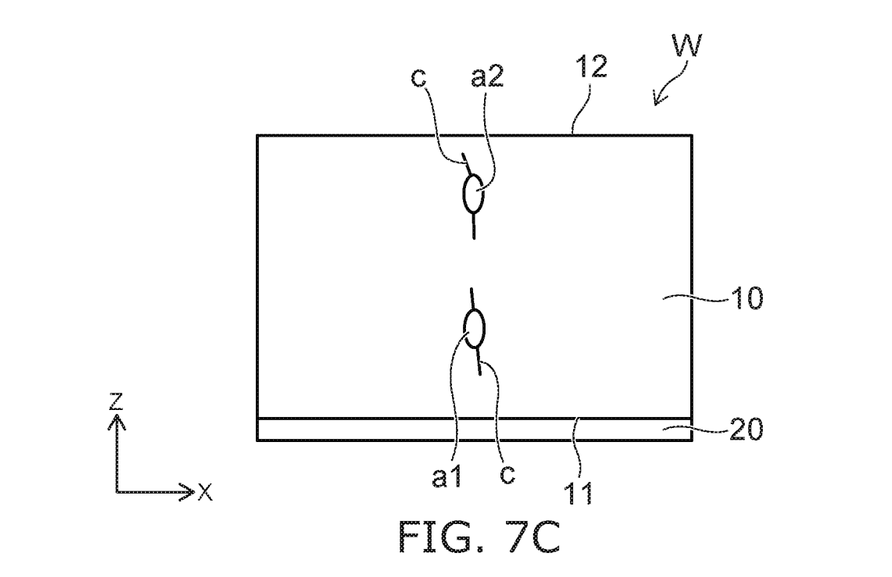
FIG. 7C is a schematic cross-sectional view of the laser beam irradiation portion of the second scanning process of the embodiment of the invention.

The second scanning process is performed after the first scanning process. FIG. 7A is a schematic plan view of the laser beam irradiation portion of the second scanning process, and FIG. 7B and FIG. 7C are schematic cross-sectional views of the laser beam irradiation portion of the second scanning process. FIG. 7B illustrates a cross section along the Y-direction, which is the scanning direction of the laser beam, and FIG. 7C illustrates a cross section along the X-direction orthogonal to the scanning direction of the laser beam.

In the second scanning process, the laser beam is irradiated through the second surface 12 side and scanned discretely along the Y-direction at a second irradiation pitch in a region of the interior of the substrate 10 between the second surface 12 and the first modified regions a1. By scanning at the second irradiation pitch, multiple second modified regions a2 are formed discretely in the Y-direction.

In the second scanning process, the output of the laser beam is not less than 0.05 W and not more than 0.2 W, e.g., 0.10 W. The second irradiation pitch is wider than the first irradiation pitch of the first scanning process, is not less than 3 µm and not more than 5 µm, e.g., 3.5 µm when scanning in the m-axis direction, and is not less than 5 µm and not more than 10 µm, e.g., 6.5 µm when scanning in the a-axis direction. The setting value of the focus position of the laser beam in the second scanning process is shallower than the setting value of the focus position of the laser beam in the first scanning process and may be, for example, a position at a depth of 10 to 35 µm from the second surface 12.

For example, when the modified regions are densely arranged to overlap as in the first modified regions a1, among the cracks that extend in the three directions recited above, the cracks that extend in directions other than the scanning direction (in the example, the Y-direction) connect easily, and the cracks meander easily.

On the other hand, in the second scanning process, the laser beam is irradiated at the second irradiation pitch, which is wider than the first irradiation pitch of the first scanning process; thereby, the second modified regions a2 are formed at a wider pitch than the first modified regions a1. Thereby, as shown in FIG. 7A, the cracks c can be caused to extend while suppressing the meandering along the scanning direction by mutually connecting the cracks c extending in the scanning direction while suppressing the connection of the cracks c extending in the directions other than the scanning direction.

Figure 8A:
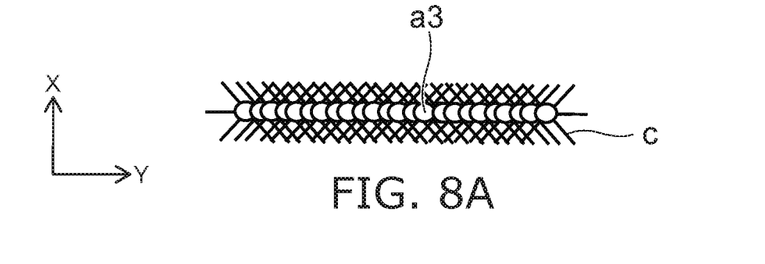
FIG. 8A is a schematic plan view of a laser beam irradiation portion of a third scanning process of the embodiment of the invention.
Figure 8B:
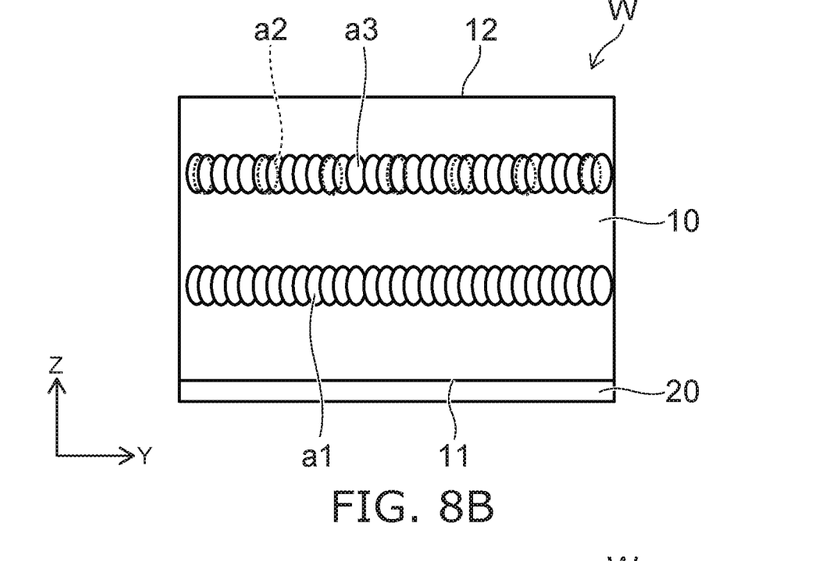
FIG. 8B is a schematic cross-sectional view of the laser beam irradiation portion of the third scanning process of the embodiment of the invention.
Figure 8C:
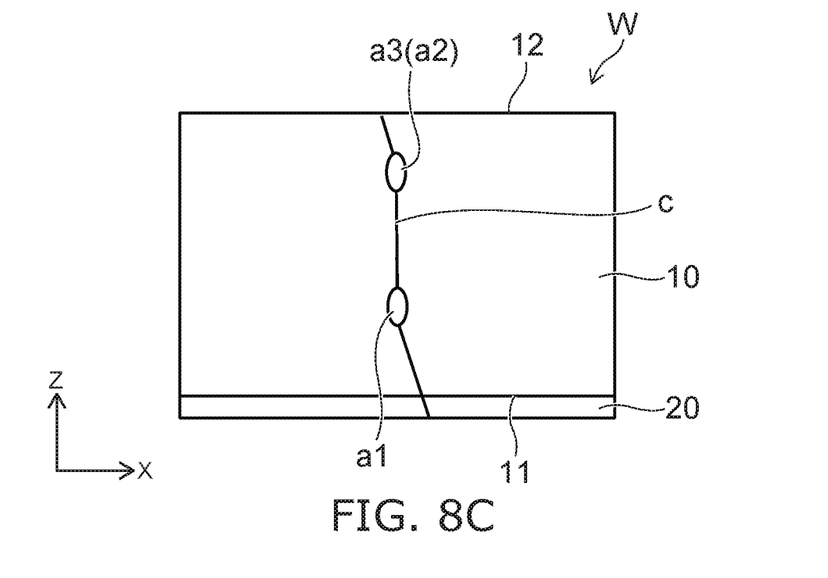
FIG. 8C is a schematic cross-sectional view of the laser beam irradiation portion of the third scanning process of the embodiment of the invention.

The third scanning process is performed after the second scanning process. FIG. 8A is a drawing of the laser beam irradiation portion of the third scanning process when viewed from the Z-direction, and FIG. 8B and FIG. 8C are schematic cross-sectional views of the laser beam irradiation portion of the third scanning process. FIG. 8B shows a cross section along the Y-direction, which is the scanning direction of the laser beam. In FIG. 8B, the second modified regions a2 are shown by broken lines. FIG. 8C shows a cross section along the X-direction orthogonal to the scanning direction of the laser beam.

In the third scanning process, the laser beam is irradiated through the second surface 12 side and scanned discretely along the Y-direction at a third irradiation pitch at a depth in the interior of the substrate 10 within the range of the second modified regions a2. By the third scanning process, multiple third modified regions a3 are formed more densely than the second modified regions a2 along the Y-direction at a depth within the range of the second modified regions a2.

The output of the laser beam in the third scanning process is higher than the output of the laser beam in the second scanning process and is not less than 0.1 W and not more than 0.5 W, e.g., 0.14 W. The third irradiation pitch is wider than the first irradiation pitch of the first scanning process and narrower than the second irradiation pitch of the second scanning process, and is not less than 2 µm and not more than 4 µm, e.g., 2 µm. The setting value of the focus position of the laser beam in the third scanning process is the same as that of the second scanning process and may be, for example, a position at a depth of 10 to 35 µm from the second surface 12.

Although the cracks c are caused to extend easily in the thickness direction of the wafer W by increasing the output of the laser beam in the laser beam irradiation process, the meandering of the cracks c also occurs easily. In the second scanning process described above, the cracks are formed such that the meandering along the scanning direction is suppressed by using a laser beam output lower than that of the third scanning process. Then, in the third scanning process, by scanning with a higher laser beam output and at a narrower pitch than the second scanning process, the cracks c that are formed in the second scanning process easily can be caused to extend in the thickness direction of the wafer W while still suppressing the meandering.

Here, the occurrence of the cracks is due to the stress generated when forming the modified regions being released by the occurrence of the cracks. If the irradiation pitch is set to be too narrow, the modified regions are formed proximate to the modified regions of which the stress has been released by the cracks. Accordingly, the stress is not generated easily and cracks do not occur easily for the modified regions proximate to such modified regions including cracks. Accordingly, in the third scanning process, the cracks that were formed in the second scanning process can be caused to extend easily by scanning at the third irradiation pitch, which is wider than the first irradiation pitch of the first scanning process.

By performing the first scanning process, the second scanning process, and the third scanning process such as those described above, the meandering of the cracks can be suppressed while maintaining a high fracture strength in the laser beam irradiation process before singulation. As a result, unintended breaking in the laser beam irradiation process and chipping of the light-emitting element after singulation can be suppressed, and the productivity can be increased.

Compared to the second scanning process and the third scanning process, the laser beam irradiation of the first scanning process is irradiated into a region proximate to the semiconductor structure 20; therefore, the damage of the semiconductor structure 20 can be suppressed by setting the output of the laser beam to be, for example, 0.2 W or less.

If the cracks c shown in FIG. 6C that are formed by the first scanning process reach the region where the second modified regions a2 and the third modified regions a3 are formed, the cracks that are formed in the second scanning process easily meander due to the effects of the cracks c formed in the first scanning process. Even if such meandering cracks are caused to extend in the third scanning process, the extension occurs while undesirably meandering.

Therefore, in the second scanning process, the laser beam is scanned in a region closer to the second surface 12 than the cracks c extending from the first modified region a1 toward the second surface 12. Thus, by performing the second scanning process, the meandering is suppressed when causing the cracks to extend in the third scanning process. Also, by setting the output of the laser beam in the first scanning process to be, for example, 0.2 W or less, the cracks c that extend in the direction from the first modified region a1 toward the second surface 12 do not lengthen too much. Accordingly, by setting the output of the laser beam to 0.2 W or less, the cracks c can be prevented from reaching the regions where the second modified regions a2 and the third modified regions a3 are formed.

Although the first scanning process, the second scanning process, and the third scanning process described above in the laser irradiation of the embodiment are performed first along the X-direction, the first scanning process, the second scanning process, and the third scanning process may be performed first along the Y-direction.

After the laser beam irradiation process, for example, first, as shown in FIG. 4, the wafer W may be separated into the multiple bars 30 along the dicing lines L1. Subsequently, as shown in FIG. 5, the wafer W is separated into the multiple light-emitting elements 50 along the dicing lines L2. For example, the separating into the bars 30 and the separating into the light-emitting elements 50 may be performed by applying a force to the wafer W by using a pressing member.

At the side surfaces of the separated light-emitting elements 50, the modified regions a1 to a3 described above are exposed as regions having higher surface roughness than the portions without the modified regions a1 to a3.

Certain embodiments of the present invention have been described as examples. However, the present invention is not limited to these examples. Based on the above-described embodiments of the present invention, all embodiments that can be implemented with appropriately design modification by one skilled in the art are also within the scope of the present invention as long as the gist of the present invention is included. Further, within the scope of the spirit of the present invention, one skilled in the art can conceive various modifications, and the modifications fall within the scope of the present invention.

What is claimed is:

1. A method for manufacturing a light-emitting element, the method comprising:
    providing a wafer comprising:
        a substrate having a first surface and a second surface, and
        a semiconductor structure provided at the first surface;
    irradiating a laser beam into an interior of the substrate from a second surface side of the substrate, which comprises:
        forming a plurality of first modified regions in the interior of the substrate by scanning the laser beam at a first irradiation pitch along a first direction parallel to the second surface,
        subsequently, forming a plurality of second modified regions in the interior of the substrate between the second surface and the first modified regions by scanning the laser beam at a second irradiation pitch along the first direction, the second irradiation pitch being wider than the first irradiation pitch, and
        subsequently, forming a plurality of third modified regions in the interior of the substrate at a depth within a range of the second modified regions by scanning the laser beam at a third irradiation pitch along the first direction, an output of the laser beam in the step of forming the plurality of third modified regions being higher than an output of the laser beam in the step of forming the plurality of second modified regions, the third irradiation pitch being narrower than the second irradiation pitch; and
    subsequently, separating the wafer into a plurality of light-emitting elements.

2. The method according to claim 1, wherein:
    the first irradiation pitch is 2.5 μm or less.

3. The method according to claim 1, wherein:
    the third irradiation pitch is wider than the first irradiation pitch.

4. The method according to claim 2, wherein:
    the third irradiation pitch is wider than the first irradiation pitch.

5. The method according to claim 1, wherein:
    an output of the laser beam in the step of forming the plurality of first modified regions is 0.2 W or less.

6. The method according to claim 2, wherein:
an output of the laser beam in the step of forming the plurality of first modified regions is 0.2 W or less.

7. The method according to claim 3, wherein:
an output of the laser beam in the step of forming the plurality of first modified regions is 0.2 W or less.

8. The method according to claim 4, wherein:
an output of the laser beam in the step of forming the plurality of first modified regions is 0.2 W or less.

9. The method according to claim 1, wherein:
in the step of forming the plurality of second modified regions, the laser beam is scanned in a region closer to the second surface than a crack extending from the first modified region toward the second surface.

10. The method according to claim 2, wherein:
in the step of forming the plurality of second modified regions, the laser beam is scanned in a region closer to the second surface than crack extending from the first modified region toward the second surface.

11. The method according to claim 3, wherein:
in the step of forming the plurality of second modified regions, the laser beam is scanned in a region closer to the second surface than crack extending from the first modified region toward the second surface.

12. The method according to claim 4, wherein:
in the step of forming the plurality of second modified regions, the laser beam is scanned in a region closer to the second surface than crack extending from the first modified region toward the second surface.

13. The method according to claim 5, wherein:
in the step of forming the plurality of second modified regions, the laser beam is scanned in a region closer to the second surface than crack extending from the first modified region toward the second surface.

14. The method according to claim 1, wherein:
the step of irradiating the laser beam into the interior of the substrate further comprises:
forming a plurality of fourth modified regions in the interior of the substrate by scanning the laser beam at a fourth irradiation pitch along a second direction parallel to the second surface and crossing the first direction,
subsequently, forming a plurality of fifth modified regions in the interior of the substrate between the second surface and the first modified regions by scanning the laser beam at a fifth irradiation pitch along the second direction, the fifth irradiation pitch being wider than the fourth irradiation pitch, and
subsequently, forming a plurality of sixth modified regions in the interior of the substrate at a depth within a range of the fifth modified regions by scanning the laser beam at a sixth irradiation pitch along the second direction, an output of the laser beam in the step of forming the plurality of sixth modified regions being higher than an output of the laser beam in the step of forming the plurality of fifth modified regions, the sixth irradiation pitch being narrower than the fifth irradiation pitch.

15. The method according to claim 2, wherein:
the step of irradiating the laser beam into the interior of the substrate further comprises:
forming a plurality of fourth modified regions in the interior of the substrate by scanning the laser beam at a fourth irradiation pitch along a second direction parallel to the second surface and crossing the first direction,
subsequently, forming a plurality of fifth modified regions in the interior of the substrate between the second surface and the first modified regions by scanning the laser beam at a fifth irradiation pitch along the second direction, the fifth irradiation pitch being wider than the fourth irradiation pitch, and
subsequently, forming a plurality of sixth modified regions in the interior of the substrate at a depth within a range of the fifth modified regions by scanning the laser beam at a sixth irradiation pitch along the second direction, an output of the laser beam in the step of forming the plurality of sixth modified regions being higher than an output of the laser beam in the step of forming the plurality of fifth modified regions, the sixth irradiation pitch being narrower than the fifth irradiation pitch.

16. The method according to claim 3, wherein:
the step of irradiating the laser beam into the interior of the substrate further comprises:
forming a plurality of fourth modified regions in the interior of the substrate by scanning the laser beam at a fourth irradiation pitch along a second direction parallel to the second surface and crossing the first direction,
subsequently, forming a plurality of fifth modified regions in the interior of the substrate between the second surface and the first modified regions by scanning the laser beam at a fifth irradiation pitch along the second direction, the fifth irradiation pitch being wider than the fourth irradiation pitch, and
subsequently, forming a plurality of sixth modified regions in the interior of the substrate at a depth within a range of the fifth modified regions by scanning the laser beam at a sixth irradiation pitch along the second direction, an output of the laser beam in the step of forming the plurality of sixth modified regions being higher than an output of the laser beam in the step of forming the plurality of fifth modified regions, the sixth irradiation pitch being narrower than the fifth irradiation pitch.

17. The method according to claim 4, wherein:
the step of irradiating the laser beam into the interior of the substrate further comprises:
forming a plurality of fourth modified regions in the interior of the substrate by scanning the laser beam at a fourth irradiation pitch along a second direction parallel to the second surface and crossing the first direction,
subsequently, forming a plurality of fifth modified regions in the interior of the substrate between the second surface and the first modified regions by scanning the laser beam at a fifth irradiation pitch along the second direction, the fifth irradiation pitch being wider than the fourth irradiation pitch, and
subsequently, forming a plurality of sixth modified regions in the interior of the substrate at a depth within a range of the fifth modified regions by scanning the laser beam at a sixth irradiation pitch along the second direction, an output of the laser beam in the step of forming the plurality of sixth modified regions being higher than an output of the laser beam in the step of forming the plurality of fifth modified regions, the sixth irradiation pitch being narrower than the fifth irradiation pitch.

18. The method according to claim 5, wherein:
the step of irradiating the laser beam into the interior of the substrate further comprises:

forming a plurality of fourth modified regions in the interior of the substrate by scanning the laser beam at a fourth irradiation pitch along a second direction parallel to the second surface and crossing the first direction, subsequently, forming a plurality of fifth modified regions in the interior of the substrate between the second surface and the first modified regions by scanning the laser beam at a fifth irradiation pitch along the second direction, the fifth irradiation pitch being wider than the fourth irradiation pitch, and subsequently, forming a plurality of sixth modified regions in the interior of the substrate at a depth within a range of the fifth modified regions by scanning the laser beam at a sixth irradiation pitch along the second direction, an output of the laser beam in the step of forming the plurality of sixth modified regions being higher than an output of the laser beam in the step of forming the plurality of fifth modified regions, the sixth irradiation pitch being narrower than the fifth irradiation pitch.

19. The method according to claim 6, wherein:

the step of irradiating a laser beam into the interior of the substrate further comprises:

forming a plurality of fourth modified regions in the interior of the substrate by scanning the laser beam at a fourth irradiation pitch along a second direction parallel to the second surface and crossing the first direction, subsequently, forming a plurality of fifth modified regions in the interior of the substrate between the second surface and the first modified regions by scanning the laser beam at a fifth irradiation pitch along the second direction, the fifth irradiation pitch being wider than the fourth irradiation pitch, and subsequently, forming a plurality of sixth modified regions in the interior of the substrate at a depth within a range of the fifth modified regions by scanning the laser beam at a sixth irradiation pitch along the second direction, an output of the laser beam in the step of forming the plurality of sixth modified regions being higher than an output of the laser beam in the step of forming the plurality of fifth modified regions, the sixth irradiation pitch being narrower than the fifth irradiation pitch.

20. The method according to claim 9, wherein:

the step of irradiating a laser beam into the interior of the substrate further comprises:

forming a plurality of fourth modified regions in the interior of the substrate by scanning the laser beam at a fourth irradiation pitch along a second direction parallel to the second surface and crossing the first direction, subsequently, forming a plurality of fifth modified regions in the interior of the substrate between the second surface and the first modified regions by scanning the laser beam at a fifth irradiation pitch along the second direction, the fifth irradiation pitch being wider than the fourth irradiation pitch, and subsequently, forming a plurality of sixth modified regions in the interior of the substrate at a depth within a range of the fifth modified regions by scanning the laser beam at a sixth irradiation pitch along the second direction, an output of the laser beam in the step of forming the plurality of sixth modified regions being higher than an output of the laser beam in the step of forming the plurality of fifth modified regions, the sixth irradiation pitch being narrower than the fifth irradiation pitch.

* * * * *